(12) United States Patent
Kong et al.

(10) Patent No.: US 10,340,389 B2
(45) Date of Patent: Jul. 2, 2019

(54) MULTI-GATE THIN FILM TRANSISTORS, MANUFACTURING METHODS THEREOF, ARRAY SUBSTRATES, AND DISPLAY DEVICES

(71) Applicant: BOE TECHNOLOGY GROUP CO., LTD., Beijing (CN)

(72) Inventors: Xiangyong Kong, Beijing (CN); Xiaming Zhu, Beijing (CN); Xiaodi Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 5 days.

(21) Appl. No.: 15/329,180

(22) PCT Filed: Nov. 12, 2015

(86) PCT No.: PCT/CN2015/094391
§ 371 (c)(1),
(2) Date: Jan. 25, 2017

(87) PCT Pub. No.: WO2016/188052
PCT Pub. Date: Dec. 1, 2016

(65) Prior Publication Data
US 2017/0207346 A1    Jul. 20, 2017

(30) Foreign Application Priority Data

May 28, 2015 (CN) .......................... 2015 1 0282237

(51) Int. Cl.
*H01L 29/786* (2006.01)
*H01L 21/28* (2006.01)
(Continued)

(52) U.S. Cl.
CPC ........ *H01L 29/78633* (2013.01); *H01L 21/28* (2013.01); *H01L 27/124* (2013.01);
(Continued)

(58) Field of Classification Search
CPC ......... H01L 29/78633; H01L 29/78648; H01L 27/1225; H01L 27/124; H01L 29/42384; H01L 29/7869
See application file for complete search history.

(56) References Cited

U.S. PATENT DOCUMENTS

2005/0059219 A1* 3/2005 Tayanaka ............ H01L 21/6835
438/458
2010/0085339 A1* 4/2010 Tanaka ................ H01L 27/1446
345/207
(Continued)

FOREIGN PATENT DOCUMENTS

CN   101140911 A    3/2008
CN   102315278 A    1/2012
(Continued)

OTHER PUBLICATIONS

Office Action from corresponding Chinese Application No. 201510282237.8, dated Jul. 17, 2017 (20 pages).
(Continued)

*Primary Examiner* — Matthew C Landau
*Assistant Examiner* — Mark Hatzilambrou
(74) *Attorney, Agent, or Firm* — Harness, Dickey & Pierce, P.L.C.

(57) ABSTRACT

The present disclosure discloses in embodiments a thin film transistor and a manufacturing method thereof, an array substrate. The thin film transistor comprises: a base substrate, an active layer, a source, a gate, and a drain. Two ends of the active layer are connected to the source and the drain, respectively. The gate comprises a top gate and a bottom gate arranged opposite to each other in a direction perpendicular to the base substrate, the top gate comprising a top gate top portion and a top gate side portion connected to the top gate top portion, the top gate side portion extending from the top gate top portion towards the base substrate. The
(Continued)

active layer is sandwiched between the top gate top portion and the bottom gate. A sidewall of the active layer is at least partially surrounded by the top gate side portion.

20 Claims, 4 Drawing Sheets

(51) Int. Cl.
*H01L 29/66* (2006.01)
*H01L 29/76* (2006.01)
*H01L 27/12* (2006.01)
*H01L 29/24* (2006.01)
*H01L 29/417* (2006.01)
*H01L 29/423* (2006.01)

(52) U.S. Cl.
CPC .......... *H01L 27/1225* (2013.01); *H01L 29/24* (2013.01); *H01L 29/41733* (2013.01); *H01L 29/42384* (2013.01); *H01L 29/66* (2013.01); *H01L 29/66969* (2013.01); *H01L 29/76* (2013.01); *H01L 29/7869* (2013.01); *H01L 29/78648* (2013.01); *H01L 29/78696* (2013.01)

(56) References Cited

U.S. PATENT DOCUMENTS

| | | |
|---|---|---|
| 2012/0007084 A1 | 1/2012 | Park et al. |
| 2014/0042395 A1 | 2/2014 | Shim et al. |
| 2015/0062475 A1 | 3/2015 | Kim et al. |
| 2015/0171156 A1* | 6/2015 | Miyake ............... H01L 27/3276 257/43 |
| 2015/0187860 A1* | 7/2015 | Seo .................... H01L 27/3276 257/40 |

FOREIGN PATENT DOCUMENTS

| | | |
|---|---|---|
| CN | 102956649 A | 3/2013 |
| CN | 102983135 A | 3/2013 |
| CN | 103594476 A | 2/2014 |
| CN | 104393051 A | 3/2015 |
| JP | 2001177100 A | 6/2001 |

OTHER PUBLICATIONS

Written Opinion of the International Searching Authority from corresponding PCT Application No. PCT/CN2015/094391, dated Feb. 29, 2016 (3 pages).
International Search Report from corresponding PCT Application No. PCT/CN2015/094391, dated Feb. 26, 2016 (5 pages).

* cited by examiner

MULTI-GATE THIN FILM TRANSISTORS, MANUFACTURING METHODS THEREOF, ARRAY SUBSTRATES, AND DISPLAY DEVICES

CROSS-REFERENCE TO RELATED APPLICATION

This application claims the benefit and priority of Chinese Patent Application No. 201510282237.8, filed on May 28, 2015, the entire content of which is incorporated by reference herein.

FIELD OF THE DISCLOSURE

The present invention relates to the field of semiconductor technology, and particularly, to a thin film transistor, a manufacturing method thereof, an array substrate, and a display device.

BACKGROUND

With the progress of process technology, a thin film transistor has been widely used in a display to meet the need for a thinned and miniaturized display. During the operation of the display, the thin film transistor is easily irradiated by light, and when the light is irradiated to the active layer, the OFF state leakage current thereof will be increased, leading to the deterioration of characteristics of the thin film transistor.

There is a conventional thin film transistor comprising a gate, a gate insulating layer formed on the gate, an active layer formed on the gate insulating layer, and a source and a drain formed on the active layer and spaced from each other. In this structure, the gate is located below the active layer, the light irradiated from below the active layer can be blocked, while the light irradiated from above the active layer is not blocked and can be irradiated from between the source and the drain to the active layer, thereby causing the deterioration of the characteristics of the thin film transistor.

BRIEF SUMMARY OF THE DISCLOSURE

An embodiment of the present invention provides a thin film transistor and a manufacturing method of the same, an array substrate and a display device, which may prevent the active layer from being irradiated with light, thereby improving the characteristics of the thin film transistor. The technical solution is as follows:

In a first aspect, the presently disclosed embodiments provide a thin film transistor, comprising: a base substrate, and an active layer, a source, a gate, and a drain formed on the base substrate. Two ends of the active layer are connected to the source and the drain, respectively. The gate comprises a top gate and a bottom gate, the top gate comprising a top gate top portion and a top gate side portion connected to the top gate top portion, the top gate side portion extending from the top gate top portion towards the base substrate. The active layer is sandwiched between the top gate top portion and the bottom gate, and a sidewall of the active layer is at least partially surrounded by the top gate side portion.

Alternatively, the gate, the source and the drain are made of a non-transparent conductive material.

Alternatively, the drain comprises a drain bottom layer. The drain bottom layer, the bottom gate and the source are formed in the same layer on the base substrate and spaced apart from one another, and the bottom gate is located between the source and the drain bottom layer.

Further, the thin film transistor further comprises a gate insulating layer. The gate insulating layer is formed on the base substrate and covers the drain bottom layer, the bottom gate and the source; and first via holes corresponding to the drain bottom layer and the source respectively are formed in the gate insulating layer; the active layer is formed on the gate insulating layer, the active layer is connected to the drain bottom layer and the source through the first via holes.

Alternatively, the thin film transistor further comprises a passivation layer formed on the gate insulating layer and covering the active layer. A connecting second via hole corresponding to the base substrate is formed in the passivation layer and in the gate insulating layer. A connecting third via hole corresponding to the drain bottom layer is formed. The drain further comprises a drain top layer which is connected to the drain bottom layer through the third via hole. A top gate side portion at least extending from the passivation layer through the second via hole to the gate insulating layer. The third via hole and the second via hole are spaced apart, and the third via hole and the second via hole together surround the sidewall of the active layer.

In one embodiment, the cross-section of the third via hole and the cross-section of the second via hole together form a rectangular frame-like structure.

Alternatively, a connecting fourth via hole is further formed in the passivation layer and the gate insulating layer, and the top gate and the bottom gate are connected through the fourth via hole.

In one embodiment, the active layer has a rectangular structure, and the top gate side portion surrounds three sides of the rectangular structure.

In one embodiment, the active layer has a rectangular structure, and the top gate side portion surrounds two sides of the rectangular structure.

Alternatively, the thin film transistor further comprises a gate insulating layer covering the gate and a passivation layer formed on the gate insulating layer, and wherein the drain comprises a drain bottom layer formed on the gate insulating layer and a drain top layer formed on the passivation layer.

Alternatively, the active layer is an oxide semiconductor layer.

Alternatively, the material of the oxide semiconductor layer comprises IGZO, ITZO or ZnON.

Alternatively, the thickness of the oxide semiconductor layer is about 10-150 nm.

Alternatively, the gate, the source, and the drain are made of opaque metal.

In a second aspect, the presently disclosed embodiments provide a manufacturing method of a thin film transistor, comprising:

providing a base substrate;

forming an active layer, a source, a gate and a drain on the base substrate, two ends of the active layer being respectively connected to the source and the drain, wherein the gate comprises a top gate and a bottom gate, the top gate comprising a top gate top portion and a top gate side portion connected to the top gate top portion, the top gate top portion and the bottom gate being arranged opposite to each other in a direction perpendicular to the base substrate, the top gate side portion extending from the top gate top portion toward the base substrate, and wherein the active layer is sandwiched between the top gate top portion and the bottom gate, the sidewall of the active layer being at least partially surrounded by the top gate side portion.

Alternatively, the gate, the source and the drain are made of a non-transparent conductive material.

Alternatively, forming an active layer, a source, a gate and a drain on the base substrate comprises:

forming the bottom gate, the source and the drain bottom layer on a base substrate, the drain bottom layer, the bottom gate and the source layer being formed spaced apart in the same layer on the base substrate, and the bottom gate being located between the source and the drain bottom layer;

forming the gate insulating layer on the base substrate so as to cover the bottom gate, the source, and the drain bottom layer, and forming first via holes corresponding to the source and the drain bottom layer respectively in the gate insulating layer;

forming the active layer on the gate insulating layer;

forming the passivation layer on the gate insulating layer so as to cover the active layer, and forming a connecting second via hole corresponding to the base substrate in the passivation layer and the gate insulating layer and forming a connecting third via hole in the passivation layer and the gate insulating layer corresponding to the drain bottom layer;

forming the top gate and the drain top layer on the passivation layer, the drain top layer being connected to the drain bottom layer through the third via hole, the top gate side portion at least extending from the passivation layer to the gate insulating layer through the second via hole.

In a third aspect, the presently disclosed embodiments provide an array substrate, comprising the thin film transistor described above. Alternatively, the array substrate comprises a base substrate, wherein gate lines, data lines, a pixel electrode layer and the thin film transistors are provided on the base substrate. A drain of the thin film transistor is connected to the pixel electrode layer. A gate of the thin film transistor is connected to the gate line. A source of the thin film transistor is connected to the data line.

In a fourth aspect, the presently disclosed embodiment further provides a display device comprising the array substrate described above.

The technical solution provided by the embodiment of the present invention has the following beneficial effects.

In the disclosed embodiment, the bottom gate under the active layer may block the light irradiated from below the oxide semiconductor layer, the top gate side portion surrounding the sidewall of the active layer may block the light irradiated from the sidewall of the active layer, and the top gate top portion positioned above the active layer may block the light irradiated from above the active layer, so that the situations where the active layer is irradiated by light may be reduced, and the characteristics of the thin film transistor may be prevented from deterioration caused by light.

BRIEF DESCRIPTION OF THE DRAWINGS

In order to more clearly illustrate the technical solution of embodiments of the present invention, the drawings to be used in the description of the embodiments will be briefly described below. Apparently, the drawings described below merely relate to some embodiments of the present invention. Those of ordinary skill in the art may also obtain other drawings from these drawings without creative work.

DETAILED DESCRIPTION

Figure 1:
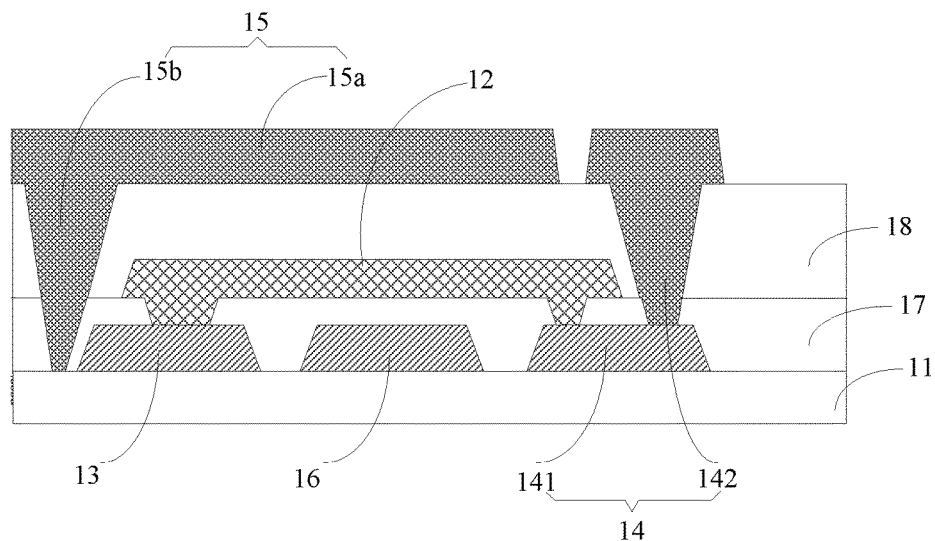
FIG. 1 is a schematic cross-sectional view of a thin film transistor provided by an embodiment of the present disclosure.

In order that the objects, technical solutions and advantages of the present disclosure will become clearer, embodiments of the present disclosure will be described in further detail below with reference to the accompanying drawings. The thicknesses and shapes of the layers in the drawings do not reflect the true proportions of the array substrate, but are intended to be illustrative only of the present disclosure.

In the description of the present disclosure, it is to be noted that the orientation or positional relationship indicated by the term "upper", "lower", "top", "bottom" or the like is based on the orientation or positional relationship shown in the drawings, is merely to conveniently illustrate the present disclosure and simplify the description, instead of indicating or implying that the apparatus or element indicated must be of a particular orientation and is constructed and operated in a particular orientation, and is therefore not to be construed as limiting the present disclosure.

In addition, in the description of the disclosure, "a plurality of" means two or more, unless otherwise specified.

Embodiments of the present disclosure provide a thin film transistor, comprising: a base substrate; and an active layer, a source, a gate, and a drain formed on the base substrate. Two ends of the active layer are connected to the source and the drain, respectively. The gate comprises a top gate and a bottom gate, the top gate comprising a top gate top portion and a top gate side portion connected to the top gate top portion, the top gate top portion and the bottom gate are oppositely arranged perpendicular to the direction of the base substrate, the top gate side portion extending from the top gate top portion toward the base substrate. The active layer is sandwiched between the top gate top portion and the bottom gate, and a sidewall of the active layer is at least partially surrounded by the top gate side portion. The gate, the source and the drain may be made of a non-transparent conductive material.

In one implementation of this embodiment, the non-transparent conductive material may be a translucent conductive material, wherein the translucent conductive material may be a conductive material having a transmittance of 15% or less, preferably a conductive material having a transmittance of 5% or less. In a preferred implementation of the present embodiment, the non-transparent conductive material is an opaque conductive material, such as an opaque metal. Therefore, in the embodiments of the present disclosure, the description will be made taking the opaque metal as an example.

Figure 5:
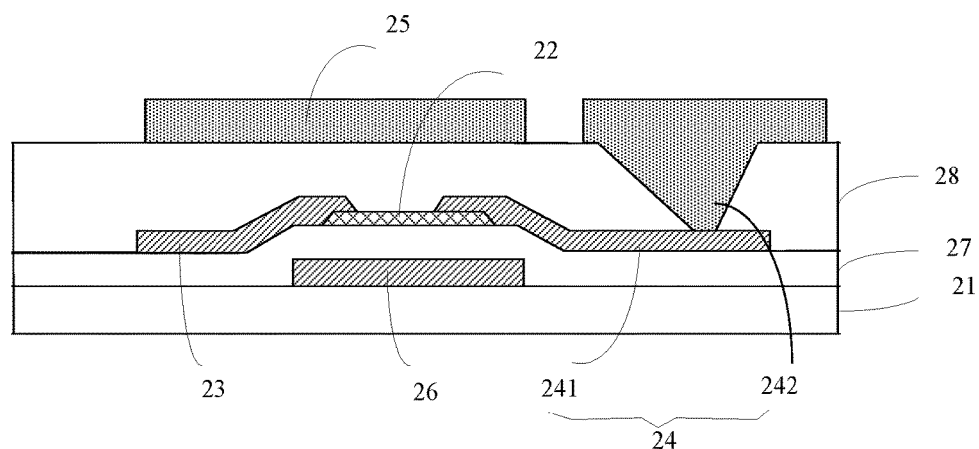
FIG. 5 is a schematic cross-sectional view of another thin film transistor provided in the presently disclosed embodiment.

Alternatively, the active layer may have a rectangular structure, and the top gate side portion may surround three sides of the rectangular structure (as in the embodiment shown in FIG. 1), or the top gate side portion also may surround two sides of the rectangular structure (as in the embodiment shown in FIG. 5).

It should be noted that in the presently disclosed embodiment, the active layer comprises a top surface, a bottom surface, and a sidewall connecting the top surface and the bottom surface. The top surface of the active layer is opposite to the top gate top portion, and the bottom surface of the active layer is opposite to the bottom gate. Expression of the sidewall of the active layer is at least partially surrounded by the top gate side portion means that the top gate side portion extends from the top gate top portion toward the base substrate until it blocks the sidewall of the active layer, i.e., at least extends into the gate insulating layer.

In the embodiment of the present disclosure, the bottom gate under the active layer may block the light irradiated from below the oxide semiconductor layer, the top gate side portion surrounding the sidewall of the active layer may block the light that is irradiated from the sidewall of the active layer, and the top grate side portion positioned above the active layer may block the light irradiated from above the active layer, so that the situations where the active layer is irradiated by light may be reduced, and further the characteristics of the thin film transistor may be prevented from deteriorating due to light.

FIG. 1 shows a specific structure of a thin film transistor provided in the embodiment of the present disclosure. FIG. 1 is a schematic cross-sectional view of the thin film transistor provided in the embodiment of the present disclosure. As shown in FIG. 1, the thin film transistor comprises a base substrate 11, and an active layer 12, a source 13, a drain 14, and a gate formed on the base substrate 11. Two ends of the active layer 12 are connected to the source 13 and the drain 14, respectively. The gate comprises a top gate 15 and a bottom gate 16, the top gate 15 comprising a top gate top portion 15a and a top gate side portion 15b connected to the top gate top portion 15a, the top gate top portion 15a and the bottom gate 16 are arranged opposite to each other in a direction perpendicular to the base substrate 11, and the top gate side portion 15b extending from the top gate top portion 15a toward the base substrate 11. The active layer 12 is sandwiched between the top gate top portion 15a and the bottom gate 16, and the sidewall of the active layer 12 is at least partially surrounded by the top gate side portion 15b.

Wherein, the base substrate 11 may be a glass substrate, a transparent plastic substrate or the like, and the present disclosure is not limited thereto.

The material of the active layer 12 may be an oxide semiconductor, polysilicon, amorphous silicon or the like. Since the oxide semiconductor is more sensitive to light, the present disclosed embodiment is particularly applicable to oxide semiconductor thin film transistors. In the present embodiment, the active layer 12 is an oxide semiconductor layer. The material of the oxide semiconductor layer of the embodiment of the present disclosure comprises, but is not limited to, IGZO (Indium Gallium Zinc Oxide), ITZO (Indium Tin Zinc Oxide) or ZnON (nitrogen oxide of zinc). In one embodiment, the thickness of the oxide semiconductor layer may be 10 to 150 nm.

In the present embodiment, the drain 14 comprises a drain bottom layer 141. The drain bottom layer 141, the bottom gate 16, and the source 13 are formed spaced apart in the same layer on the base substrate 11, and the bottom gate 16 is positioned between the source 14 and the drain bottom layer 141.

In the disclosed embodiment, the bottom gate 16, source 13, and the drain bottom layer 141 are provided in the same layer. In order to save the manufacturing process, the bottom gate, the source and the drain bottom layers are preferably made of the same material so that the bottom gate, the source and the drain bottom layer may be formed on the base substrate by a one-time patterning process, thereby reducing the number of times the mask plate is used, simplifying the preparation process of the thin film transistor, whereby the production cost thereof can be reduced.

As described above, in the present embodiment, the bottom gate 16, the source 13, and the drain bottom layer 141 are made of opaque metal. Specifically, a monolayer film including of one of, or a multilayer composite film including a plurality of, molybdenum (Mo), molybdenum niobium alloy (MoNb), aluminum (Al), aluminum neodymium alloy (AlNd), titanium (Ti) and copper (Cu) may be used; preferably, a monolayer or multilayer composite film including Mo, Al or a Mo—Al-containing alloy, is used, for example, a Mo/Al/Mo three-layer composite film. Because the resistance of Al is small and the oxidation resistance of Mo is strong, the use of such composite film structure can ensure the signal transmission speed and improve the service life. In one embodiment, the thicknesses of the bottom gate, source, and drain bottom layer may be 100 nm to 500 nm.

The thin film transistor also comprises a gate insulating layer 17. The gate insulating layer 17 is formed on the base substrate 11 and covers the drain bottom layer 141, the bottom gate 16, and the source 13, so that the drain bottom layer 141, the bottom gate 16, and the source 13 are insulated from each other. In the gate insulating layer 17, first via holes 171 (see FIG. 4b) are provided corresponding to the drain bottom layer 141 and the source 13, respectively, in the gate insulating layer 17. The active layer 12 is formed on the gate insulating layer 17, and the active layer 12 is connected to the drain bottom layer 141 and the source 13 through the first via holes 171, respectively.

Wherein, the gate insulating layer 17 may be a monolayer film formed of one of, or a multilayer composite film formed of two of, silicon oxide (SiOx), silicon nitride (SiNx), hafnium oxide (HfOx), silicon nitrogen oxide (SiON), AlOx. A stacked structure of $SiN_x/SiO_x$ or a stacked structure of $SiN_x/SiON/SiO_x$ is preferable. The gate insulating layer 17 may have a thickness of 100 to 600 nm.

The thin film transistor also comprises a passivation layer 18. The passivation layer 18 is formed on the gate insulating layer 17 and covers the active layer 12. A connecting second via hole 181 (see FIG. 4d) are formed corresponding to the base substrate in the passivation layer 18 and the gate insulating layer 17, and a connecting third via hole 182 is formed corresponding to the drain bottom layer 141. The drain 14 further comprises a drain top layer 142; the drain top layer 142 is connected to the drain bottom layer 141 through the third via hole 182. The top gate 15 is connected to the base substrate 11 through the second via hole 181 (i.e., the top gate side portion 15b is connected to the base substrate 11). The third via hole 182 and the second via hole 181 are spaced apart, and the third via hole 182 and the second via hole 181 together surround the sidewall of the active layer 12.

In the disclosed embodiment, with the third via hole 182 and the second via hole 181 surrounding the sidewall of the active layer 12, the top gate side portion and the drain top layer may surround the sidewall of the active layer, the gate, the drain and the source to form a substantially closed space, and further the active layer is in a state in which the active layer is not substantially irradiated with light, so that the characteristics of the thin film transistor can be further prevented from being deteriorated due to light. At the same time, a drain top layer is formed on the passivation layer. When the thin film transistor is applied to the array substrate, the pixel electrode layer may be patterned directly on the passivation layer to facilitate connection with the pixel electrode layer.

It should be noted that in the embodiment as shown in FIG. 1, the second via hole 181 extends from the passivation layer 18 to the surface of the base substrate 11, so that the active layer can be more closely blocked from light to be irradiated, and in other implementations, the second via hole 181 may extend from the passivation layer 18 into the gate insulating layer 17 without reaching the surface of the base substrate 11 as long as it can block the light irradiated from the side wall of the active layer. That is, in the disclosed embodiment, the top gate side portion at least extends from the passivation layer to the gate insulating layer through the second via hole.

Figure 2:
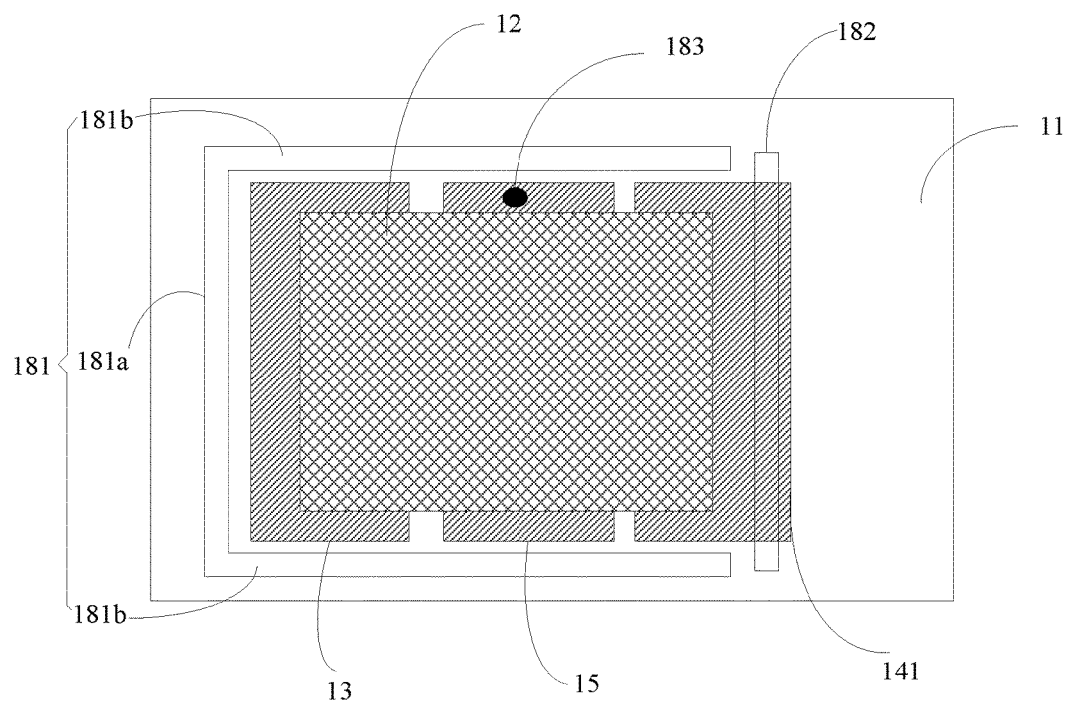
FIG. 2 is a schematic top view of a thin film transistor provided by the embodiment of the present invention, with the top gate and a part of the drain removed.

In conjunction with FIG. 2, FIG. 2 is a schematic top view of a thin film transistor provided by the embodiment of the present invention, with the top gate and a part of the drain removed. As shown in FIG. 2, in the present embodiment, the cross-sectional shape of the second via hole 181 is a rectangular frame (comprising a bottom side 181a and two sides 181b vertically connected to two ends of the bottom side 181a) with an opening on one side, while the cross-sectional shape of the third via hole 182 is linear, and the cross-sectional shapes of the second via hole 181 and the third via hole 182 together form a rectangular frame-like structure. It is easy to know that the cross-sectional shape of the second via hole 181 and the cross-sectional shape of the third via hole 182 also may be arc-shaped, and the cross-section of the second via hole 181 and the cross-sectional shape of the third via hole 182 together form a circular frame-like structure, or in other implementations, the cross-sectional shapes of the second via hole 181 and the third via hole 182 together may form a polygonal frame or the like, as long as it can surround the four sides of the active layer, while this disclosure is not limited thereto.

It should be noted that the sidewalls of the via holes (comprising the first via hole, the second via hole, the third via hole, and the like) in the embodiments of the present disclosure are not generally perpendicular to the board surface of the base substrate, but may have a certain slope angle, and the slope angle is usually 30° to 70°.

Likewise, in the present embodiment, the top gate 15 is made of an opaque metal. Specifically, the top gate 15 may be a monolayer film formed of one of, or a multilayer composite film formed of a plurality of, Mo, MoNb, Al, AlNd, Ti and Cu, preferably a monolayer or multilayer composite film made of Mo, Al or a Mo—Al-containing alloy, for example, a Mo/Al/Mo three-layer composite film. Because the resistance of Al is small and the oxidation resistance of Mo is strong, the use of such composite film structure can ensure the signal transmission speed and improve the service life. In practice, the thickness of the top gate formed on the passivation layer may be 200 to 900 nm. It will be readily appreciated that the top gate 15 and the bottom gate 16 may be made of the same material or may be made of different materials.

The passivation layer 18 may be a monolayer film formed of one of, or a multilayer composite film formed of two of, silicon oxide (SiOx), silicon nitride (SiNx), hafnium oxide (HfOx), silicon nitrogen oxide (SiON), AlOx. A stacked structure of SiNx/SiOx or a stacked structure of SiNx/SiON/SiOx is preferable. In one embodiment, the passivation layer may have a thickness of 100 to 600 nm.

As shown in FIG. 2, in the embodiment of the present disclosure, a connecting fourth via hole 183 is further formed in the passivation layer 18 and the gate insulating layer 17. The top gate 15 and the bottom gate 16 are connected through the fourth via hole 183 to electrically connect the top gate and bottom gate such that the two gates operate simultaneously. This accelerates the turn-on of the channel of the charge in the thin film transistor while providing a better guiding capability for the charge to improve the conductive capability thereof and hence the response speed. Further, when the thin film transistor is stopped, a stable negative voltage is supplied to the two gates of the thin film transistor to accelerate the speed of turn-off of the channel of the thin film transistor while improving the ability of the thin film transistor to block charge migration to reduce the leakage current of the thin film transistor, thereby reducing power consumption. Also, the top and bottom gates are connected by a fourth via hole, so that when the thin film transistor of the present disclosure is applied to the array substrate, there is no need for wiring the top and bottom gates, respectively, thereby reducing the wiring of the array substrate. It will be readily appreciated that in other embodiments a fourth via hole may not be provided and the top and bottom gates may be connected in an external wiring.

It will be readily appreciated that the fourth via hole 183 and the second via hole 181 may be formed in the same process step.

Figure 3:
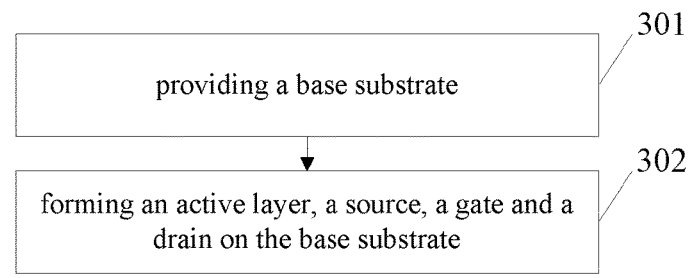
FIG. 3 is a flow chart of a manufacturing method of a thin film transistor provided in the embodiment of the present disclosure.

FIG. 3 is a manufacturing method of a thin film transistor provided in the embodiment of the present disclosure. As shown in FIG. 3, the method for manufacturing the thin film transistor comprises:

Step 301: Providing a base substrate.

Step 302: Forming an active layer, a source, a gate and a drain on the base substrate. Wherein, the active layer has two ends connected to the source and the drain, respectively; the gate comprises a top gate and a bottom gate, the top gate comprises a top gate top portion and a top gate side portion connected to the top gate top portion, the top gate top portion and the bottom gate are arranged opposite to each other in a direction perpendicular to the base substrate, and the top gate side portion extends from the top gate top portion toward the base substrate; the active layer is sandwiched between the top gate top portion and the bottom gate, and a sidewall of the active layer is at least partially surrounded by the top gate side portion. The gate, the source and the drain are made of a non-transparent conductive material.

In particular, when the manufacturing method of the disclosed embodiment is used for preparing the thin film transistor shown in FIGS. 1-2, the step 302 may comprise the following steps.

Figure 4A:
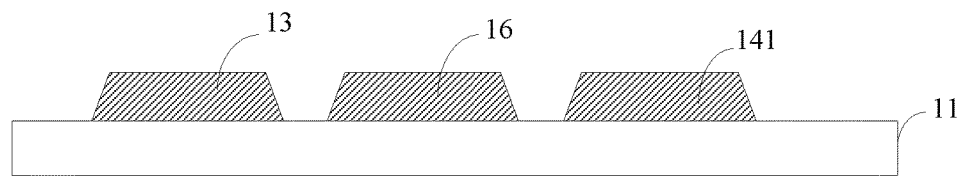
FIGS. 4a-4d are preparing process diagrams for the thin film transistor provided by the presently disclosed embodiments.

Step 1: forming a bottom gate 16, a source 13, and a drain bottom layer 141 on the base substrate 11. As shown in FIG. 4a, the drain bottom layer 141, the bottom gate 16, and the source 13 are formed in the same layer on the base substrate 11 and spaced apart from one another, and the bottom gate 16 is located between the source 13 and the drain bottom layer 141.

Figure 4B:
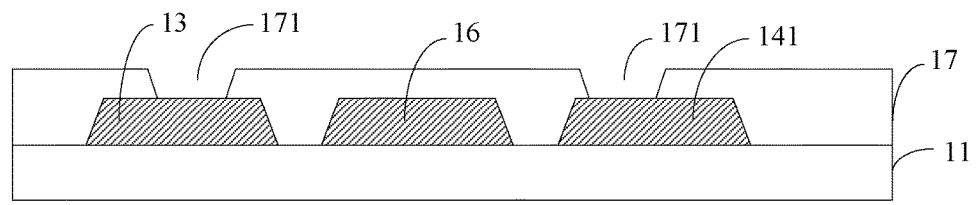

Step 2: forming a gate insulating layer 17 on the base substrate 11 so as to cover the bottom gate 16, the source 13 and the drain bottom layer 141, and forming first via holes 171 corresponding to the source 13 and the drain bottom layer 141, respectively, in the gate insulating layer 17, as shown in FIG. 4b. Specifically, the gate insulating layer 17 may be formed by PECVD (Plasma Enhanced Chemical Vapor Deposition), and during the manufacturing process, it is necessary to control the hydrogen content of the film layer at a lower level.

Figure 4C:
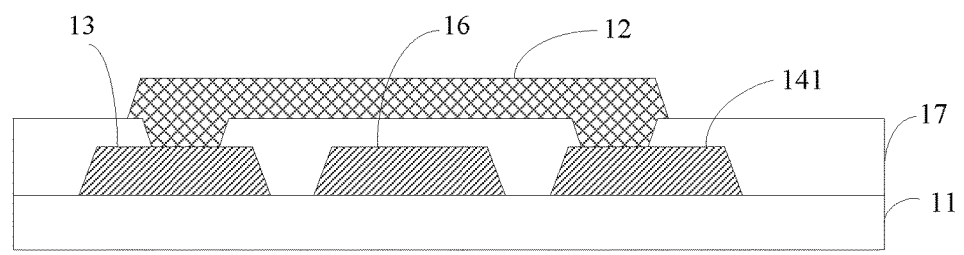

Step 3: forming an active layer 12 on the gate insulating layer 17, as shown in FIG. 4c, two ends of the active layer 12 being connected to the source 13 and the drain bottom layer 141 through the first via hole 171. In particular, the active layer may be prepared by sputter deposition.

Figure 4D:
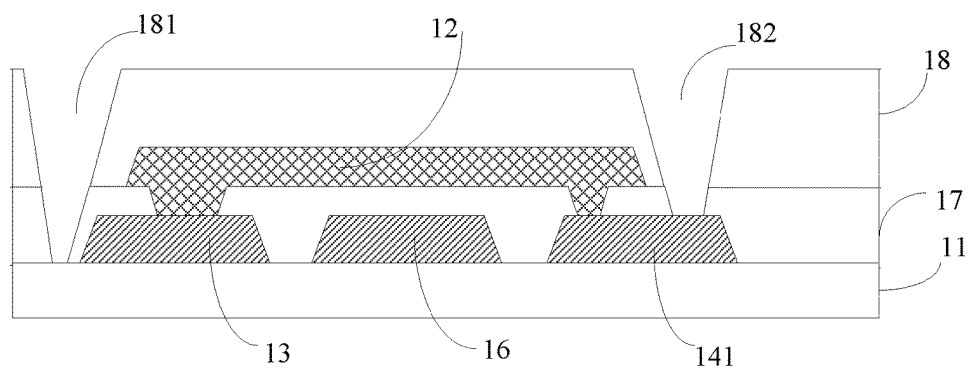

Step 4: forming a passivation layer 18 on the gate insulating layer 17 so as to cover the active layer 12, forming a connecting third via hole 182 corresponding to the drain bottom layer 141 in the passivation layer 18 and the gate insulating layer 17, and forming a connecting second via hole 181 corresponding to the base substrate 11 in the passivation layer 18 and the gate insulating layer 17, as shown in FIG. 4d. In particular, the passivation layer 18 may be formed by PECVD, and during the manufacturing process, it is necessary to control the hydrogen content of the film layer at a lower level.

Step 5: forming a top gate 15 and a drain top layer 142 on the passivation layer 18. The drain top layer 142 is connected to the drain bottom layer 141 through a third via hole 182. The top gate side portion 15b extends from the passivation layer 18 to the surface of the base substrate 11 through the second via hole 181, resulting in a thin film transistor as shown in FIG. 1.

It is easy to know that the top gate side portion 15b extends to the surface of the base substrate 11 to obtain a better light blocking effect, whereas in other implementations, the top gate side portion 15b may also extend only to the gate insulating layer, and may also play the role of blocking a certain light irradiated from the sidewalls of the active layer.

As can be seen from the foregoing steps, the manufacturing method of the thin film transistor shown in FIGS. 1-2 only employs a five-time patterning process, with simple process steps and low manufacturing cost.

Figure 6:
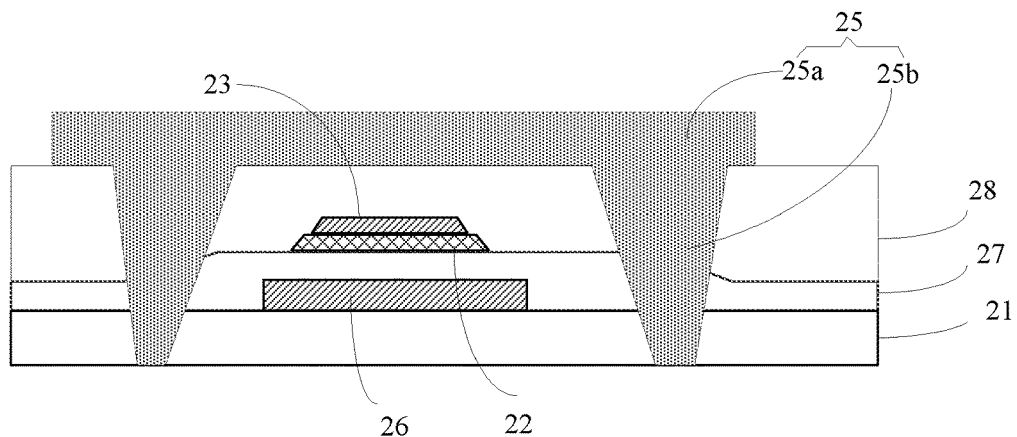
FIG. 6 is another schematic cross-sectional view of the thin film transistor of FIG. 5.

FIGS. 5 and 6 show the structure of yet another thin film transistor provided in the embodiments of the present disclosure. The cross-sections shown in FIG. 5 and FIG. 6 are perpendicular to each other. As shown in FIGS. 5 and 6, the thin film transistor comprises a base substrate 21, and an active layer 22, a source 23, a drain 24, and a gate formed on the base substrate 21. Two ends of the active layer 22 are connected to the source 23 and the drain 24, respectively. The gate comprises a top gate 25 and a bottom gate 26, the top gate 25 comprises a top gate top portion 25a and a top gate side portion 25b connected to the top gate top portion 25a, the top gate top portion 25a and the bottom gate 26 are arranged opposite to each other in a direction perpendicular to the base substrate 21, and the top gate side portion 25b extends from the top gate top portion 25a toward the base substrate 21. The active layer 22 is sandwiched between the top gate top portion 25a and the bottom gate 26, and the sidewall of the active layer 22 is at least partially surrounded by the top gate side portion 25b.

Further, in the embodiment shown in FIG. 5, the active layer 22 has a rectangular structure in which the opposite ends are respectively provided with the source 23 and the drain 24, and the top gate side portion 25b surrounds two sides of the active layer 22, where the source 23 and the drain 24 are not formed.

In the thin film transistor shown in FIG. 5, the bottom gate 26 is formed on the base substrate 21. The thin film transistor also comprises a gate insulating layer 27 formed on the base substrate 21 and covering the gate 26. The active layer 22 is formed on the gate insulating layer 27 and is formed over the bottom gate 26. The source 23 and the drain 24 are formed at two ends of the active layer 22.

The thin film transistor of the present embodiment further comprises a passivation layer 28 formed on the gate insulating layer 27 and covering the source 23, the drain 24, and the active layer 22. A top gate 25 is formed on the passivation layer 28. Connecting via holes 281 are formed in the passivation layer 28 and the gate insulating layer 27, and the via holes 281 may be provided on the opposite sides of the active layer 22, where the source 23 and the drain 24 are not formed. The top gate side portion 25b surrounds the active layer 22 together with the source 23 and the drain 24 through the via holes 281.

In one embodiment, the via hole on one of the opposite sides of the active layer 22, where the source 23 and the drain 24 are not formed, may extend from the passivation layer 28 to the base substrate 21, and the via hole on the other of the opposite sides of the active layer 22, where the source 23 and the drain 24 are not formed, may extend from the passivation layer 28 to the bottom gate 26.

In another embodiment, the via holes on the opposite sides of the active layer 22, where the source 23 and the drain 24 are not formed, both extend from the passivation layer 28 to the base substrate 21, or both extend from the passivation layer 28 to the bottom gate.

It will be readily appreciated that in the foregoing two embodiments, the top gate only surrounds both sides of the active layer, and the top gate together with the source and the drain substantially surrounds the active layer. In other embodiments the via holes 281 may also be arranged surrounding the active layer 22, the source 23, and the drain 24. In this case, the top gate 25 may surround the active layer 22.

Alternatively, the drain 24 of the disclosed embodiment may also comprise a drain bottom layer 241 formed on the gate insulating layer 27 and connected to the active layer 22, and a drain top layer 242 formed on the passivation layer 28 and connected to the drain bottom layer 241 through a via hole.

The materials of the source, the drain and the gate in this embodiment may be the same as those of the source, the drain and the gate in the embodiment shown in FIG. 1 and will not be described here.

Figure 7:
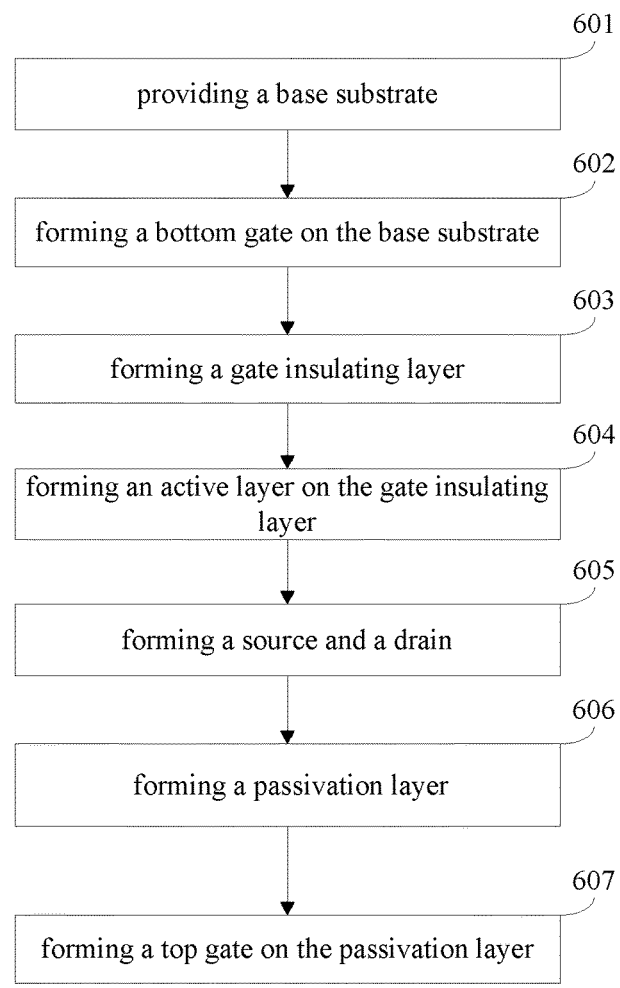
FIG. 7 is a flowchart of the manufacturing method of the another thin film transistor provided by the presently disclosed embodiment.

FIG. 7 shows a manufacturing method of the thin film transistor shown in FIG. 5. As shown in FIG. 7, the manufacturing method of the thin film transistor comprises:

Step 601: providing a base substrate.

Step 602: forming a bottom gate on the base substrate.

Step 603: forming a gate insulating layer, the gate insulating layer being formed on the base substrate and covering the bottom gate.

Step 604: forming an active layer on the gate insulating layer, the active layer being formed over the bottom gate.

Step 605: forming the source and the drain, the source and the drain being positioned on opposite sides of the active layer.

Step 606: forming a passivation layer and forming connecting via holes in the passivation layer and the gate insulating layer, the passivation layer being formed on the gate insulating layer and covering the source, the drain and the active layer, the via holes being arranged on the opposite sides of the active layer, where the source and the drain are not formed.

The via holes may also be arranged surrounding the active layer, the source, and the drain, as previously described.

Step 607: forming a top gate on the insulating layer, the top gate extending to around the sidewall of the active layer through the via holes formed in step 606 so that the top gate surrounds the active layer together with the source and the drain through the via holes.

The disclosed embodiments also provide an array substrate comprising a thin film transistor provided by any of the preceding embodiments. Specifically, the array substrate comprises a base substrate on which gate lines, data lines, a pixel electrode layer and the thin film transistors are provided, the drain of the thin film transistor being connected to the pixel electrode layer, the gate of the thin film transistor being connected to the gate line, the source of the thin film transistor being connected to the data line.

Wherein, the pixel electrode layer may be a transparent conductive metal oxide layer such as ITO (Indium Tin Oxides), IZO (Indium Zinc Oxides), or the like.

Based on the same inventive concept, embodiments of the present disclosure also provide a display device comprising the array substrate provided in the foregoing embodiments.

In a specific implementation, the display device provided in the embodiments of the present disclosure may be any product or component having a display function such as a mobile phone, a tablet computer, a television set, a display, a notebook computer, a digital photo frame, a navigator, or the like.

The foregoing is intended only as a preferred embodiment of the present disclosure and is not intended to be limiting of the present disclosure, and any modifications, equivalent substitutions, improvements and the like within the spirit and principles of the present disclosure are intended to be encompassed by the present disclosure.

What is claimed is:

1. A thin film transistor comprising a base substrate, an active layer, a source, a gate, and a drain, the active layer, the source, the gate, and the drain disposed on the base substrate, the active layer including an end connected to the source and another end connected to the drain,
    the gate including a top gate and a bottom gate, the top gate including a top gate top portion and a top gate side portion connected to the top gate top portion, the top gate top portion and the bottom gate arranged opposite to each other in a direction perpendicular to the base substrate, the top gate side portion extending from the top gate top portion towards the base substrate and not physically contacting the bottom gate,
    the active layer sandwiched between the top gate top portion and the bottom gate, and the active layer including a sidewall at least partially surrounded by the top gate side portion.

2. The thin film transistor according to claim 1, wherein the gate, the source and the drain are made of a non-transparent conductive material.

3. The thin film transistor according to claim 2, wherein the drain comprises a drain bottom layer, and wherein the drain bottom layer, the bottom gate and the source are disposed in a same layer on the base substrate and spaced apart from one another, and the bottom gate is located between the source and the drain bottom layer.

4. The thin film transistor according to claim 3, further comprising a gate insulating layer disposed on the base substrate and covering the drain bottom layer, the bottom gate and the source, the gate insulating layer defining first via holes corresponding to the drain bottom layer and the source, the active layer disposed on the gate insulating layer, and the active layer connected to the drain bottom layer and the source through the first via holes.

5. The thin film transistor according to claim 4, further comprising a passivation layer disposed on the gate insulating layer and covering the active layer, the passivation layer and the gate insulating layer defining a second via hole and a third via hole, the second via hole corresponding to the base substrate, the third via hole corresponding to the drain bottom layer, the drain further including a drain top layer connected to the drain bottom layer through the third via hole, the top gate side portion at least extending from the passivation layer through the second via hole to the gate insulating layer, the third via hole and the second via hole spaced apart, and the third via hole and the second via hole together surrounding the sidewall of the active layer.

6. The thin film transistor according to claim 5, wherein a cross-section of the third via hole and a cross-section of the second via hole together form a rectangular frame-like structure.

7. The thin film transistor according to claim 6, wherein the passivation layer and the gate insulating layer define a fourth via hole, and wherein the top gate and the bottom gate are connected through the fourth via hole.

8. The thin film transistor according to claim 1, wherein the active layer has a rectangular structure.

9. The thin film transistor according to claim 8, wherein the top gate side portion surrounds three sides of the rectangular structure.

10. The thin film transistor according to claim 8, wherein the top gate side portion surrounds two sides of the rectangular structure.

11. The thin film transistor according to claim 10, further comprising a gate insulating layer covering the gate and a passivation layer disposed on the gate insulating layer, and wherein the drain comprises a drain bottom layer disposed on the gate insulating layer and a drain top layer disposed on the passivation layer.

12. The thin film transistor according to 1, wherein the active layer includes an oxide semiconductor layer.

13. The thin film transistor according to claim 12, wherein a material of the oxide semiconductor layer comprises IGZO, ITZO or ZnON.

14. The thin film transistor according to claim 12, wherein the oxide semiconductor layer has a thickness of about 10-150 nm.

15. The thin film transistor according to claim 1, wherein the gate, the source, and the drain include an opaque metal.

16. An array substrate comprising the thin film transistor according to claim 1.

17. The array substrate according to claim 16, wherein said thin film transistor is a first thin film transistor, wherein the array substrate further comprises gate lines, data lines, a pixel electrode layer and one or more additional thin film transistors disposed on the base substrate, and wherein the drain of the first thin film transistor is connected to the pixel electrode layer, the gate of the first thin film transistor is connected to one of the gate lines, and the source of the first thin film transistor is connected to one of the data lines.

18. A manufacturing method of a thin film transistor, the method comprising:
    providing a base substrate; and
    forming an active layer, a source, a gate and a drain on the base substrate, the active layer including an end connected to the source and another end connected to the drain,
    the gate including a top gate and a bottom gate, the top gate including a top gate top portion and a top gate side portion connected to the top gate top portion, the top gate top portion and the bottom gate arranged opposite to each other in a direction perpendicular to the base substrate, the top gate side portion extending from the top gate top portion toward the base substrate and not physically contacting the bottom gate, the active layer sandwiched between the top gate top portion and the bottom gate, and the active layer including a sidewall at least partially surrounded by the top gate side portion.

19. The manufacturing method according to claim 18, wherein forming the gate, the source and the drain includes forming the gate, the source and the drain of a non-transparent conductive material.

20. The manufacturing method according to claim 19, wherein forming the active layer, the source, the gate and the drain on the base substrate comprises:

forming the bottom gate, the source and a drain bottom layer in a same layer on the base substrate and spaced apart from one another, and the bottom gate located between the source and the drain bottom layer;

forming a gate insulating layer on the base substrate to cover the bottom gate, the source, and the drain bottom layer, and forming first via holes corresponding to the source and the drain bottom layer respectively in the gate insulating layer;

forming the active layer on the gate insulating layer;

forming a passivation layer on the gate insulating layer to cover the active layer, and forming a second via hole corresponding to the base substrate in the passivation layer and the gate insulating layer and forming a third via hole corresponding to the drain bottom layer; and forming the top gate and a drain top layer on the passivation layer, the drain top layer connected to the drain bottom layer through the third via hole, and the top gate side portion at least extending from the passivation layer to the gate insulating layer through the second via hole.

* * * * *